United States Patent
Zhao et al.

(10) Patent No.: US 12,401,169 B2
(45) Date of Patent: Aug. 26, 2025

(54) LASER LIGHT ENERGY AND DOSE CONTROL USING REPETITION RATE BASED GAIN ESTIMATORS

(71) Applicant: Cymer, LLC, San Diego, CA (US)

(72) Inventors: Yingbo Zhao, San Diego, CA (US); Kevin O'Brien, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 901 days.

(21) Appl. No.: 17/362,053

(22) Filed: Jun. 29, 2021

(65) Prior Publication Data

US 2021/0328401 A1    Oct. 21, 2021

Related U.S. Application Data

(63) Continuation of application No. 15/495,245, filed on Apr. 24, 2017, now Pat. No. 11,081,852.

(51) Int. Cl.
| | |
|---|---|
| H01S 3/10 | (2006.01) |
| G03F 7/00 | (2006.01) |
| H01S 3/09 | (2006.01) |
| H01S 3/104 | (2006.01) |
| H01S 3/13 | (2006.01) |
| H01S 3/131 | (2006.01) |

(52) U.S. Cl.
CPC ...... *H01S 3/10069* (2013.01); *G03F 7/70025* (2013.01); *G03F 7/70558* (2013.01); *H01S 3/09* (2013.01); *H01S 3/10038* (2013.01); *H01S 3/131* (2013.01); *H01S 3/10046* (2013.01); *H01S 3/104* (2013.01); *H01S 3/1306* (2013.01)

(58) Field of Classification Search
CPC ............ G03F 7/70025; G03F 7/70575; G03F 7/70041; G03F 7/70558; H01S 3/10069; H01S 3/09702; H01S 3/097; H01S 3/10; H01S 3/10046
See application file for complete search history.

(56) References Cited

U.S. PATENT DOCUMENTS

| | | | | |
|---|---|---|---|---|
| 5,097,291 | A | * 3/1992 | Suzuki | ................ G03F 7/70558 355/53 |
| 6,418,155 | B1 | * 7/2002 | Wakabayashi | .......... H01S 3/131 372/30 |
| 7,756,171 | B2 | 7/2010 | Jacques | |
| 7,830,942 | B2 | 11/2010 | Dunstan et al. | |
| 8,102,889 | B2 | 1/2012 | Jacques et al. | |
| 2002/0006149 | A1 | 1/2002 | Spangler et al. | |
| 2007/0194836 | A1 | 8/2007 | Kim et al. | |

(Continued)

OTHER PUBLICATIONS

International Search Report and Written Opinion for PCT/US2018/025921, dated Jul. 19, 2018.

*Primary Examiner* — Steven H Whitesell
(74) *Attorney, Agent, or Firm* — DiBerardino McGovern IP Group LLC

(57) ABSTRACT

A laser system's laser light energy control and resulting dose control is improved by creating and using a set of gain estimators, one for each of a set or range of laser light pulse repetition rates. When a new repetition rate is used, its corresponding gain estimator is retrieved, used to compute the voltage to fire the laser source, and updated. The resulting generated laser light thereby avoids the convergence delay inherent in prior laser systems and, further, can repeatedly do so with subsequent specified repetition rates.

9 Claims, 4 Drawing Sheets

(56) References Cited

U.S. PATENT DOCUMENTS

| | | |
|---|---|---|
| 2008/0067457 A1 | 3/2008 | Bak |
| 2010/0098124 A1 | 4/2010 | Jacques |
| 2012/0300289 A1* | 11/2012 | Ogaki ................. H01S 3/06754 |
| | | 359/341.1 |
| 2018/0074412 A1* | 3/2018 | Aggarwal ........... G03F 7/70041 |
| 2019/0280451 A1* | 9/2019 | Asayama ................ H01S 3/104 |

* cited by examiner

LASER LIGHT ENERGY AND DOSE CONTROL USING REPETITION RATE BASED GAIN ESTIMATORS

CROSS-REFERENCE TO RELATED APPLICATIONS

This application is a continuation of U.S. application Ser. No. 15/495,245 filed on Apr. 24, 2017, which is incorporated by reference in its entirety herein.

BACKGROUND

Field of the Invention

The disclosed subject matter is in the field of laser light control and more specifically in the field of controlling the energy of a laser generated by a laser light source as may be used in semiconductor photolithography processes.

Related Art

Photolithography is a commonly used process in the semiconductor industry. Modern photolithography typically uses a laser light source, also known as a laser system, to provide very narrow band light pulses that illuminate a mask thus exposing photo-resistive material on silicon wafers, also known as substrates, in stepper-scanner devices, also known as scanners. Advances in semiconductor device parameters have put increasing demands on the performance characteristics of the laser light sources and stepper-scanners used. Improvements in precision and speed of operation of these devices are increasingly needed.

As is known in the art, the stepper-scanner device periodically communicates desired laser light parameters to the laser light source to achieve a desired dosage of laser light energy for use in the photolithographic process. In turn, the laser light source generates the laser light and outputs it to the stepper-scanner. There are, however, numerous challenges in performing these operations. For example, it can take some time for the generated laser light to stabilize on the desired parameters. Further, because of noise and other disturbances in the laser light source, it can be difficult to accurately generate the laser light at the desired energy level. What is needed are further improvements in how the laser light source quickly and accurately generates the laser light to meet the desired parameters.

SUMMARY

A system and method for laser light energy control and resulting dose control creates and uses a set of gain estimators, one for each of a range of laser light pulse repetition rates. When a new repetition rate is specified, its corresponding gain estimator is retrieved and used to adjust and fire the laser source. The resulting generated laser light thereby reduces convergence delay and, further, can repeatedly do so with subsequently specified repetition rates.

In one embodiment is a method of laser light energy control comprising: receiving, in a laser system controller, a first laser trigger command and a voltage command; converting, by the laser system controller, the voltage command to a first energy target; determining, by the laser system controller, a first laser repetition rate based on a difference between the first laser trigger command and a previous laser trigger command; retrieving, by the laser system controller, a first repetition rate gain estimator corresponding to the first laser repetition rate; determining, by the laser system controller, a first laser voltage using the first energy target and the first repetition rate gain estimator; directing, by the laser system controller, a laser source to fire using the first laser voltage; receiving, in the laser system controller, a subsequent laser trigger command and a subsequent voltage command; converting, by the laser system controller, the subsequent voltage command to a second energy target; determining, by the laser system controller, a second laser repetition rate based on a difference between the subsequent laser trigger command and the first laser trigger command, wherein the second laser repetition rate is different than the first laser repetition rate; retrieving, by the laser system controller, a second repetition rate gain estimator corresponding to the second laser repetition rate; determining, by the laser system controller, a second laser voltage using the second energy target and the second repetition rate gain estimator; and, directing, by the laser system controller, the laser source to fire using the second laser voltage.

In another embodiment is a laser system for laser light energy control comprising: a laser system controller configured to: receive a first laser trigger command and a voltage command; convert the voltage command to a first energy target; determine a first laser repetition rate based on a difference between the first laser trigger command and a previous laser trigger command; retrieve a first repetition rate gain estimator corresponding to the first laser repetition rate; determine a first laser voltage using the first energy target and the first repetition rate gain estimator; direct a laser source to fire using the first laser voltage; receive a subsequent laser trigger command and a subsequent voltage command; convert the subsequent voltage command to a second energy target; determine a second laser repetition rate based on a difference between the subsequent laser trigger command and the first laser trigger command, wherein the second laser repetition rate is different than the first laser repetition rate; retrieve a second repetition rate gain estimator corresponding to the second laser repetition rate; determine a second laser voltage using the second energy target and the second repetition rate gain estimator; and, direct the laser source to fire using the second laser voltage.

BRIEF DESCRIPTION OF THE DRAWING

Various embodiments are disclosed in the following detailed description and the accompanying drawing.

DETAILED DESCRIPTION

Described herein is a system and method for controlling the energy of a laser light source generated laser. In the present approach, the desired energy of the laser light is achieved more rapidly and more accurately than with known approaches thus improving dose control in the photolithography process. The operations and elements of this system and method will now be described.

Figure 1:
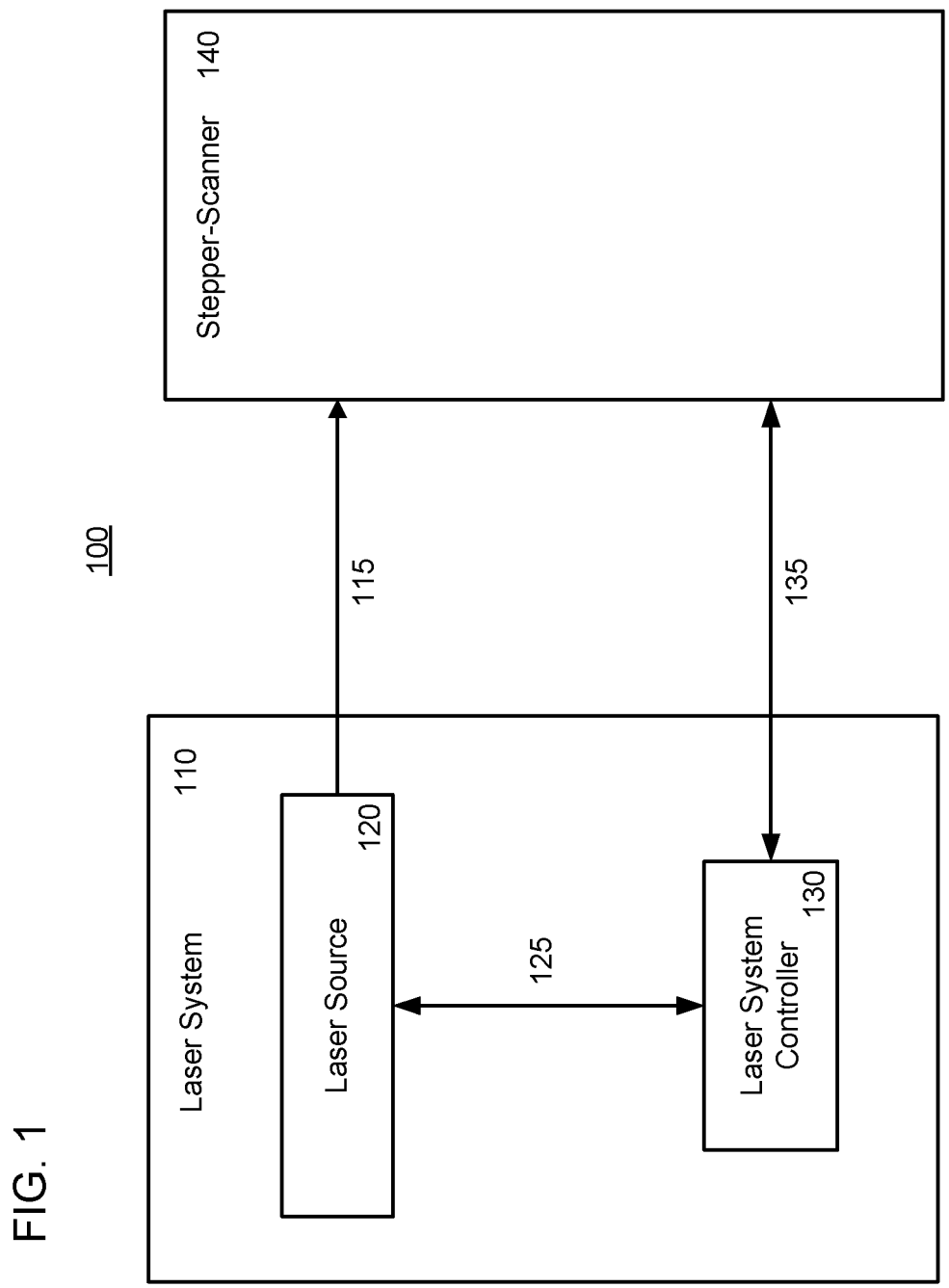
FIG. 1 is a block diagram of an exemplary laser system and scanner as may be used in one embodiment.

Referring now to FIG. 1, a block diagram 100 of a laser system 110 and scanner 140 as may be used in a modern deep ultraviolet ("DUV", e.g., having wavelengths in the range of 5-250 nanometers (nm) photolithography process and with the present approach can be seen. The source of the laser light in laser system 110 is a laser source 120, which can be a single or dual chamber system, controlled by a controller 130 via communication 125. When laser source 120 fires the resulting laser light 115 travels to scanner 140, which is responsible for exposing the semiconductor wafer.

As is known in the art, scanner 140 sends to laser system 110 via communication 135 desired parameters for the laser light to be generated by laser system 110. The parameters, intended to achieve a desired exposure in the photolithography process, typically include such things as laser light wavelength, energy level and a timing trigger for when the laser system is to fire the laser. In turn, the laser system generates the laser light 115 based on those parameters. This process then continues as scanner 140 communicates additional desired parameters for further laser light to be generated by laser system 110.

As is known in the art, there is a relationship between the amount of voltage applied to laser source 120, as specified by controller 130 via communication 125, and the resulting energy in the generated laser light. This relationship is commonly represented as dv/de, which is the derivative of voltage with respect to energy. U.S. Pat. No. 7,756,171 and U.S. patent application Ser. No. 11/900,527, each incorporated herein by reference, describe these aspects known in the art. It is known in the art to use what is called a gain estimator, an algorithm for estimating the dv/de relationship. As stated above, there is a relationship between the amount of voltage applied to laser source 120 and the resulting energy in the generated laser light. In general, the greater the applied voltage the greater the resulting energy. However, this relationship is affected by noise and other disturbances in the laser system. As such, rather than simply presuming a given voltage will always result in the same energy, a gain estimator algorithm is created by varying (or dithering, i.e., dv) the voltage locally and then using the corresponding response in energy (i.e., de) to compute de/dv as an output. This de/dv, which is the output of the gain estimator, is then used to compute the final voltage value that the laser system then uses to generate the laser light at the desired energy level. U.S. Pat. No. 8,102,889, incorporated herein by reference, describes these aspects known in the art.

However, while such known usage of a gain estimator can reduce or eliminate error or variability of the laser light energy, it still fails to address the problem of the generated laser light not providing the desired energy level during the transient phase or convergence lag. In other words, should the scanner request laser light at a different repetition rate (i.e., the number of laser pulses fired in a second, hereinafter "RepRate" or "rr", as dictated by the timing trigger received from scanner 140), laser energy performance will be temporarily worse until the gain estimator finds the new de/dv again because, as shown in FIG. 2, RepRate affects the de/dv gain.

Figure 2:
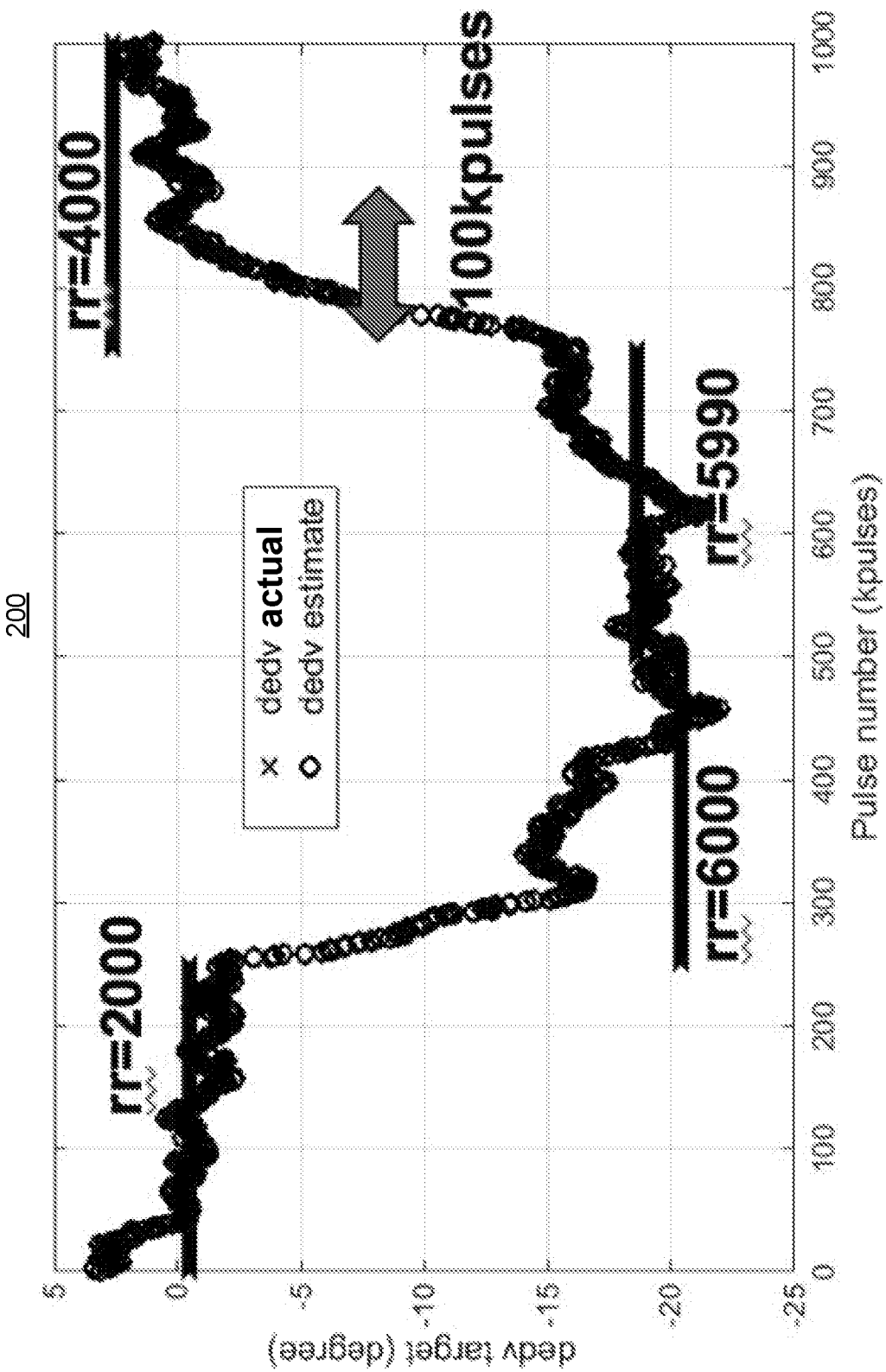
FIG. 2 is a graph showing characteristics of a generated laser light as may be used in one embodiment.

Referring now to FIG. 2, characteristics of the generated laser light can be seen in a graph form. In this example, scanner 140 has communicated a series of differing timing triggers which resulted in laser system 110 generating laser light at a RepRate of 2000, then 6000, then 5990 and then 4000 laser pulses per second. As shown, the actual de/dv (the inverse of the above-described dv/de), in degrees represented by a series of x's in the figure, is different at each of the differing RepRates. As also shown, the resulting estimated de/dv, in degrees represented by a series of o's in the figure, converges to within a small deviation from the actual de/dv within approximately 100,000 (100 k) laser pulses. Other experiments have shown that it can take up to about 30 seconds for this convergence to occur (with time=number of laser pulses divided by laser pulse RepRate, it takes about 16.67 seconds for 100 k laser pulses to occur at a RepRate of 6,000 and about 50 seconds for 100 k laser pulses to occur at a RepRate of 2,000, thus confirming that 30 seconds is a reasonable estimate). This convergence lag, that is, the number of laser pulses and/or the time between when the laser source is directed to fire at a new RepRate and the generated laser light achieves the desired energy level, detrimentally affects the desired wafer dose in scanner 140.

The present approach overcomes this problem by creating and storing a set of gain estimators each operable for a differing RepRate. Then, whenever the laser system is asked to fire the laser with a differing timing trigger interval, i.e., at a differing RepRate, a gain estimator to be operable at that RepRate can be used without waiting for convergence to the new de/dv. The benefit of this approach is then furthered when there are frequent changes in the RepRate because the convergence lag is avoided with each change.

Figure 3:
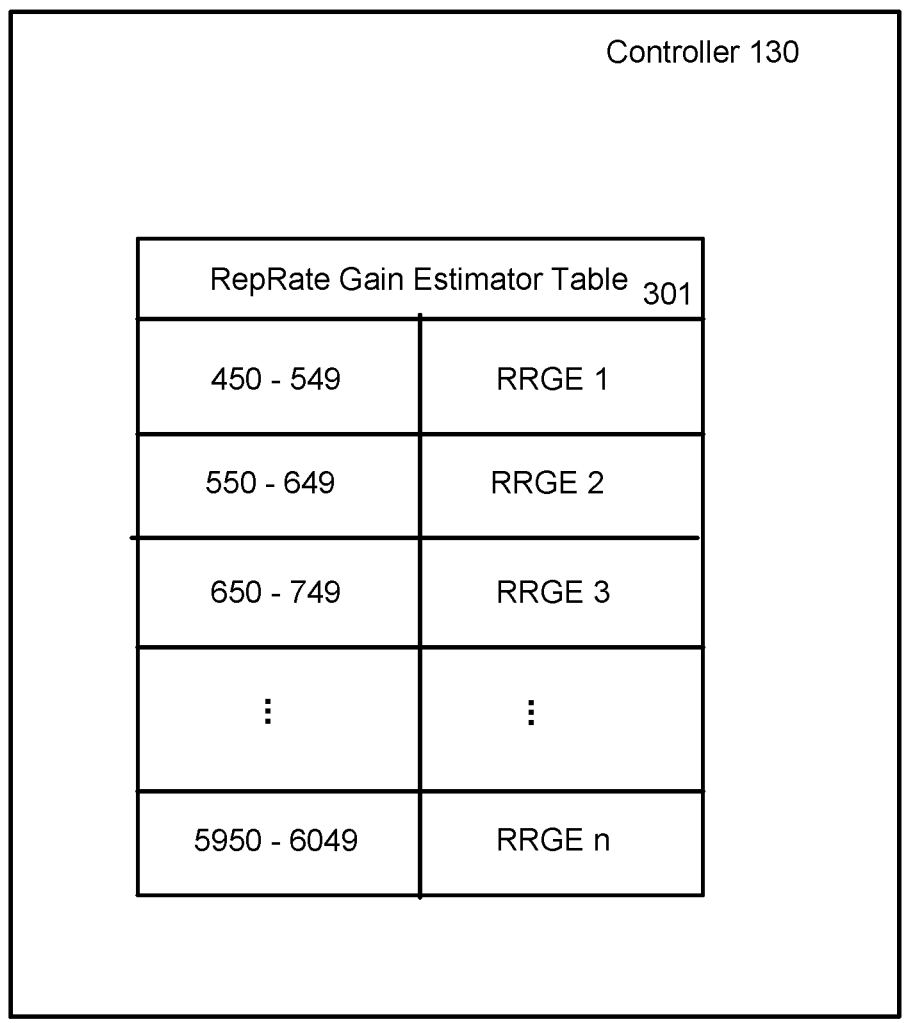
FIG. 3 is a block diagram of a laser system controller as may be used in one embodiment.

Referring now to FIG. 3, controller 130 of FIG. 1 is shown having a stored RepRate Gain Estimator ("RRGE") table 301. As shown in table 301, each row is a range of RepRates (e.g., 450-549, 550-649, etc.) with a corresponding RepRate Gain Estimator (e.g., RRGE 1, RRGE 2, RRGE 3, etc.) to be used with a RepRate in that range.

As further explanation, and as would be understood by one of skill in the art in light of the teachings herein, a gain estimator is a collection of data and a series of steps (i.e., logic and operations) that act on that data and the inputs to output the result. One example of such a gain estimator is:

$$\begin{bmatrix} x_1(k+1) \\ x_2(k+1) \end{bmatrix} = \begin{bmatrix} a_{11} & a_{12} \\ a_{21} & a_{22} \end{bmatrix} \begin{bmatrix} x_1(k) \\ x_2(k) \end{bmatrix} + \begin{bmatrix} b_{11} & b_{12} \\ b_{21} & b_{22} \end{bmatrix} \begin{bmatrix} V(k) \\ E(k) \end{bmatrix},$$

$$Dedv = \begin{bmatrix} c_1 & c_2 \end{bmatrix} \begin{bmatrix} x_1(k) \\ x_2(k) \end{bmatrix}.$$

where each stored gain estimator (i.e., each RRGE in the table) thus includes this data denoted as values $X_1$ and $X_2$), which are the state of the estimator that get updated each time the estimator executes, k refers to "value before the update" while k+1 refers to "value after the update", and a, b, and c are constants determined by the system creator.

In this way, any time a new RepRate is desired or specified, again via the timing trigger received by the laser system from the scanner, a corresponding RRGE can immediately be retrieved and used without incurring any convergence lag. It is to be understood that the correspondence between RepRate ranges and corresponding RepRate Gain Estimators can be stored in any data storage format, structure or layout and is not limited to the specific form of the table shown in the figure. Further, the particular RepRate range or quantum of values corresponding to a given RepRate Gain Estimator can be as broad or narrow as desired as they are only limited by available storage capacity.

Figure 4:
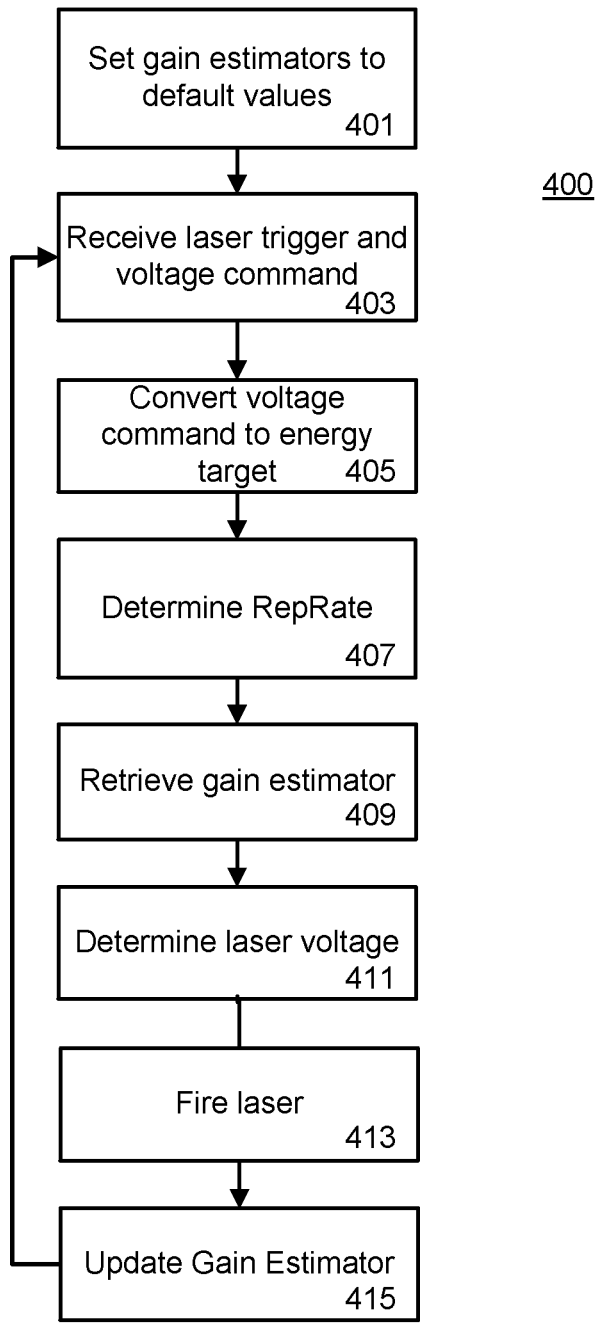
FIG. 4 is a flowchart of various embodiments of the present method of setting, updating, and using a set of gain estimators.

Referring now to FIG. 4, a flowchart of a process 400 of setting, updating, and using a set of gain estimators according to various embodiments will now be described.

In step 401, the gain estimators are set to default values. In one embodiment, the gain estimators (i.e., the RepRate Gain Estimators) in the RepRate Gain Estimator Table 301 of laser controller 130 are set to default values by initially setting the data "X" state values, as discussed above with respect to FIG. 3. In one still further embodiment, the default values are set so that the RepRate Gain Estimators will output an average of typical dv/de values, which typically range from 0.02 to 0.2, and therefore the default values are set so the RRGEs will output an average value of 0.11. It is to be understood that other default values can likewise be used and, further, that each gain estimator need not be set to the same default value.

In step 403 a laser trigger (also known as a laser firing trigger) and a voltage command are received from the scanner by the laser system. In one embodiment this laser trigger and voltage command are received from scanner 140 by laser system 110 via communication 135 and the voltage command is determined by scanner 140 based on a desired laser energy level and its knowledge of the dv/de relationship, as described above. It is to be understood that the laser trigger and the voltage command can be sent as a single communication from the scanner to the laser source or can be sent as separate communications from the scanner to the laser source in any sequence or order. In various embodiments, other command signals (e.g., digitally encoded signals) may be used in place of a voltage command.

In step 405, the laser system converts the voltage command to an energy target. In one embodiment, this conversion is performed by laser system 110, and more particularly by laser system controller 130, based on its greater knowledge of the dv/de relationship within operations of the laser system and as is understood by one of skill in the art.

In step 407, the laser system determines the RepRate of the laser. In one embodiment, this determination is performed by laser system 110, and more particularly by laser system controller 130, based on a difference between the received laser trigger command received from scanner 140 and a previously received laser trigger command from scanner 140.

In step 409, the gain estimator for the determined RepRate is retrieved. In one embodiment, this is performed by retrieving a RRGE n in RRGE Table 301 corresponding to the determined RepRate.

In step 411, the voltage with which to fire the laser, referred to herein as the laser voltage, is determined using the energy target and the retrieved gain estimator. In one embodiment, this is performed by laser system controller 130 in laser system 110 and, according to various embodiments, is performed according to the following formula:

$$V = V_o + dV/dE[(E-E_o) + \epsilon(E-E_o)^2]$$

where,
V Voltage guessed by the static control
E Energy Target
$V_o$ Reference Voltage
$E_o$ Reference Energy
$\epsilon$ Adjustment due to energy curve
dV/dE First order derivative/slope of voltage vs. energy at reference energy, which is the output of the gain estimator.

In step 413, the laser is fired. In one embodiment, the laser is fired by controller 130 directing laser source 120 to fire at the laser voltage, that is, the voltage computed by the RRGE corresponding to the trigger received from scanner 140.

In step 415, the gain estimator is updated. In one embodiment, the gain estimator is updated by controller 130 calculating a new gain estimator for the current laser pulse, based on a measured resulting energy from the current laser pulse and using gain estimator calculation techniques known in the art, and the calculated new gain estimator is then stored in RRGE Table 301 corresponding to the RepRate determined in step 407. In other embodiments all gain estimators are updated on each laser pulse by storing the calculated new gain estimator as new gain estimator values in RRGE Table 301 corresponding to all RepRates in the table. Updating all gain estimators on each laser pulse may provide a more accurate gain estimator for each RepRate than using any previously stored gain estimator (including the default gain estimator).

The process then returns to step 401 to receive a new laser trigger and voltage command.

In an alternative embodiment, the set of gain estimators is instead created without receiving commands from a scanner. In this embodiment, the voltage command and laser trigger is either generated internally within the laser system or by laser system operator input. Regardless of whether this embodiment or the one described with reference to FIG. 4 is used, the process of creating and updating the set of gain estimators can be considered a training mode for the laser system and, as such, need not actually involve any exposure of the generated laser light to a wafer in a scanner.

In an alternative embodiment, a static set of stored gain estimators corresponding to various RepRates, previously set and updated as described above with reference to FIG. 4, are then used to fire the laser without continuing to update the gain estimators as described above with reference to step 415 of FIG. 4. In such an embodiment (comprising steps 403 through 413), step 413 of firing the laser then returns to step 403 of receiving a laser trigger and voltage command without performing step 415 of updating gain estimators.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, the description and the drawing should not be considered in a limiting sense, as it is understood that the present invention is in no way limited to only the embodiments illustrated.

It is also to be understood that alternative sequences and mathematical formulas could be used within the spirit and meaning of the present invention as described herein.

Likewise, it is to be understood that laser system controller 130 can be any computing system comprising a processor and memory, including a personal computer, server, or other processing system, that runs software instructions for performing the described operations which instructions may themselves have come from or reside on a computer readable storage medium. Alternatively, laser system controller 130 can be any dedicated hardware such as an application specific integrated circuit (ASIC) or other hardwired device, with or without firmware, that is specifically configured to perform the described operations.

What is claimed is:

1. In a photolithography system, the photolithography system comprising at least a laser source and scanner, a method of laser light energy control comprising:
   providing a set of gain estimators, each gain estimator in the set of gain estimators corresponding to a respective range of laser repetition rates;

receiving communication data from the scanner of the photolithography system, the communication data including a laser trigger command and a voltage command;

converting the voltage command to an energy target;

determining a first laser repetition rate corresponding to the communication data; retrieving a first gain estimator from the set of gain estimators, the first gain estimator being associated with a first range of laser repetition rates, the first range of laser repetition rates including the first laser repetition rate;

activating the laser source to generate laser light to generate a pulse, the activating being responsive to a laser voltage determined using the first gain estimator and the energy target, and updating the first gain estimator on the pulse, the updating including obtaining a measured energy in the pulse and calculating an updated gain estimator value based at least in part on the measured energy.

2. The method of claim 1 wherein the photolithography system is a deep ultraviolet (DUV) photolithography system.

3. The method of claim 1 wherein the each gain estimator pertains to a relationship between an amount of voltage applied to the laser source and an amount of energy in laser light generated by the laser source.

4. The method of claim 1 wherein the laser voltage is determined according to the formula $$V=V_0+dV/dE[(E-E_0)+\epsilon(E-E_0)^2]$$

where V is a voltage estimate, E is the energy target, $V_0$ is a reference voltage, $E_0$ is a reference energy, $\epsilon$ is an adjustment factor, and dV/dE is a first order derivative of voltage versus energy at reference energy which is output by the gain estimator.

5. A method of laser light energy control for a laser light source, comprising:

creating a set of gain estimators, each gain estimator in the set of gain estimators corresponding to a respective range of laser repetition rates, the creating including at least:

a) generating a training-mode laser activation signal, each of the training-mode laser activation signals including at least a training-mode laser trigger command and training-mode voltage command, b) determining a laser repetition rate corresponding to the training-mode laser activation signal, c) activating the laser source responsive to the training-mode laser activation signal to generate laser pulses, d) varying a voltage level supplied to the laser source to cause an energy level of the laser pulses to reach a desired energy level, e) employing the voltage level that causes the energy of the laser pulses to reach the desired energy level to calculate a gain estimator for the laser repetition rate, and f) repeating steps a) to e) with different training-mode laser activation signals to obtain the set of gain estimators;

employing the set of gain estimators to generate laser light for performing wafer photolithography, the employing including receiving communication data from a scanner of a photolithography system, the communication data including a laser trigger command and a voltage command; determining a first laser repetition rate corresponding to the communication data, retrieving a first gain estimator from the set of gain estimators, the first gain estimator being associated with a first range of laser repetition rates, the first range of laser repetition rates including the first laser repetition rate, and activating the laser source to generate a pulse of the laser light, the activating being responsive to a laser voltage determined using the first gain estimator, further comprising updating the first gain estimator on the pulse, the updating including obtaining a measured energy in the pulse and calculating an updated gain estimator value based at least in part on the measured energy.

6. The method of claim 5 wherein the photolithography system is a deep ultraviolet (DUV) photolithography system.

7. The method of claim 5 wherein the each gain estimator pertains to a relationship between an amount of voltage applied to the laser source and an amount of energy in laser light generated by the laser source.

8. The method of claim 5 further comprising updating the set of gain estimators after the activating the laser source to generate the laser light, the updating including obtaining a measured energy in the laser light and calculating updated gain estimator values for the set of gain estimators based at least in part on the measured energy.

9. The method of claim 5 wherein the laser voltage is determined according to the formula $$V=V_0+dV/dE[(E-E_0)+\epsilon(E-E_0)^2]$$

where V is a voltage estimate, E is the energy target, $V_0$ is a reference voltage, $E_0$ is a reference energy, $\epsilon$ is an adjustment factor, and dV/dE is a first order derivative of voltage versus energy at reference energy which is output by the gain estimator.

* * * * *